US00RE40222E

(19) United States
(12) Reissued Patent
Fragapane

(10) Patent Number: US RE40,222 E
(45) Date of Reissued Patent: Apr. 8, 2008

(54) ELECTRONIC SEMICONDUCTOR POWER DEVICE WITH INTEGRATED DIODE

(75) Inventor: Leonardo Fragapane, Catania (IT)

(73) Assignee: STMicroelectronics S.r.l. (IT)

(21) Appl. No.: 10/423,493

(22) Filed: Apr. 24, 2003

Related U.S. Patent Documents

Reissue of:
(64) Patent No.: 6,222,248
Issued: Apr. 24, 2001
Appl. No.: 09/490,589
Filed: Jan. 25, 2000

(30) Foreign Application Priority Data

Jan. 25, 1999 (EP) ..... 99830023

(51) Int. Cl.
*H01L 27/082* (2006.01)
*H01L 27/102* (2006.01)
*H01L 29/70* (2006.01)
*H01L 31/11* (2006.01)

(52) U.S. Cl. ..... 257/565; 257/566; 257/570; 257/E27.053; 257/E27.055

(58) Field of Classification Search ..... 257/47, 257/197, 273–274, 477, 511, 539, 552, 565–566, 257/570, 577–578, E27.053, E27.055
See application file for complete search history.

(56) References Cited

U.S. PATENT DOCUMENTS 5,012,313 A * 4/1991 Fijihira ..... 257/546
5,365,085 A * 11/1994 Tokura et al. ..... 257/139
5,777,367 A * 7/1998 Zambrano ..... 257/355
5,973,359 A * 10/1999 Kobayashi et al. ..... 257/328
6,011,280 A * 1/2000 Fruth et al. ..... 257/137
6,031,254 A * 2/2000 Quoirin ..... 257/155

FOREIGN PATENT DOCUMENTS

EP 0450082 A1 * 10/1991
JP 60-249367 * 12/1985
JP 06140632 * 5/1994
WO WO91/17570 * 11/1991

OTHER PUBLICATIONS

Chow, T.P. et al., "P–Channel, Vertical Insulated Gate Bipolar Transistors With Collector Short," International Electron Devices Meeting, Washington, Dec. 6–9, 1987, pp. 670–673.*

* cited by examiner

*Primary Examiner*—Hoai V Pham
(74) *Attorney, Agent, or Firm*—David V. Carlson; Lisa K. Jorgenson

(57) ABSTRACT

A device including an IGBT a formed on a chip of silicon consisting of a P type substrate with an N type epitaxial layer that contains a first P type region and a termination structure, and having a first P type termination region that surrounds the first region, a first electrode in contact with the first termination region, and a second electrode shaped in the form of a frame close to the edge of the chip and connected to a third electrode in contact with the bottom of the chip. A fourth electrode made in one piece with the first electrode is in contact with the first region. The termination structure also comprises a fifth electrode in contact with the epitaxial layer along a path parallel to the edge of the first termination region and connected to the second electrode and a second P type termination region that surrounds the fifth electrode and a sixth electrode, and which is in contact with the second termination region, connected to the first electrode.

15 Claims, 4 Drawing Sheets

ELECTRONIC SEMICONDUCTOR POWER DEVICE WITH INTEGRATED DIODE

Matter enclosed in heavy brackets [ ] appears in the original patent but forms no part of this reissue specification; matter printed in italics indicates the additions made by reissue.

TECHNICAL FIELD

The present invention relates to an electronic semiconductor device having a modified insulated gate bipolar transistor with integrated diode.

BACKGROUND OF THE INVENTION

A known electronic device is a transistor of the type called IGBT (Insulated Gate Bipolar Transistor). IGBT devices are components used in power applications as an alternative to bipolar junction transistors (BJT) or field-effect power transistors, such as vertical conduction transistors, known as VDMOS (Vertical Double diffused Metal Oxide Semiconductor) transistors. They are sometimes preferred to BJT and VDMOS transistors because they have a smaller size with the same electrical performance. In some applications, however, VDMOS transistors are more advantageous than IGBT devices because they contain, as a component intrinsic to their structure, a reverse diode between the drain and source. A typical application in which this characteristic of the VDMOS is exploited is that in which the power device is used as an electronic switch in a bridge or half-bridge circuit configuration. In this configuration, the diode allows current to flow when the power device is biased in the reverse conduction direction. If an IGBT is to be used as an electronic switch in this circuit configuration, it is necessary to connect a separate diode between its emitter and collector terminals. This results in a greater complexity of construction and a larger size of the whole device.

It has been proposed that an IGBT be modified in such a way that a structure normally present in this device is used as a reverse diode. An IGBT modified in this way is described below in relation to FIG. 1.

FIG. 1 shows in section an edge portion of a chip 9 of semiconductor material, for example monocrystalline silicon. The chip 9 comprises a substrate 10 doped with P type impurities in a relatively high concentration, and consequently denoted by P+, an epitaxial layer 11 doped with N type impurities in a relatively low concentration, and consequently denoted by N−, and an N+ "buffer" layer 12 between the substrate 10 and the epitaxial layer 11. (The buffer layer may also be absent in certain types of IGBT). A diffused P type region 13 extends from the front surface of the chip 9 into the epitaxial layer 11 and is formed by a low-concentration (P−) surface part 13' and a highconcentration (P+) deep part 13". Another P type region, indicated by 14, also formed by a low-concentration part 14' and a high-concentration part 14", is shaped in such a way that it surrounds the region 13.

High-concentration N type regions 15 are formed in the regions 13 and 14. Strips of electrically conducting material, for example doped polycrystalline silicon, indicated by 16, separated from the front surface of the chip by a thin layer of dielectric material, for example silicon dioxide, are located above the surface areas of the regions 13' and 14' lying between the regions 15 and the epitaxial layer 11. The strips 16 are joined together (in a way not shown in the drawing) in a structure which also comprises a contact portion 16'. A metallic electrode 17 in contact with the bottom surface of the chip, in other words with the free surface of the substrate 10, forms the collector electrode C of the transistor. A metallic electrode 18 in contact, on the front surface, with the P+regions 13 and 14 and with the N+regions 15, but insulated from the strips 16 by layers of dielectric material 19, for example silicon dioxide, forms the emitter electrode E of the IGBT. A metallic electrode 20 in contact with the contact portion 16' forms the gate electrode of the IGBT.

It should be noted that two separate electrodes, one in contact with the region 13 and one in contact with the region 14, but connected electrically to each other by a suitable connecting element, could be provided instead of a single electrode 18 in contact with the regions 13 and 14. A further metallic electrode 21 forms an ohmic contact with the epitaxial layer 11 through a diffused high-concentration N type surface region, indicated by 22, and is shaped in the form of a frame extending close to the edge of the chip. This electrode is also connected, by a conductor external to the chip 9, to the collector electrode 17 of the IGBT.

FIG. 2 shows in a plan view, and not to scale, the chip 9 fixed to a metallic support 23 and connected electrically to three terminals of the device. More in particular, one of the three terminals, indicated by 24, is soldered to the metallic support 23, the collector electrode 17 is soldered to the metallic support 23 and is therefore connected electrically to the terminal 24, the emitter electrode 18 and the gate electrode 20 are connected by corresponding metal wires to the other two terminals 25 and 26, and the electrode 21 is connected by a wire to the terminal 24.

In operation, when a potential which is positive with respect to that of the emitter is applied to the collector, and the gate electrode is biased, with respect to the emitter electrode, at a potential greater than the conduction threshold level, a current flows from the emitter to the collector, as indicated by arrows in the Figure. Conversely, when the gate electrode is biased at a potential lower than the conduction threshold level, no current passes between the emitter and the collector and the device therefore acts as an open switch. The maximum voltage that can be applied between the collector and the emitter is determined by the breakdown voltage of the junctions which the regions 13 and 14 form with the epitaxial layer 11. The region 14 surrounds the whole active region of the device in the same way as a frame, and its low-concentration surface part 14' which extends laterally towards the edge of the chip makes it possible to obtain a breakdown voltage close to the theoretical level, owing to the known effect of reduction of the density of the field lines at the surface. The electrode 21, which is not normally connected to the collector electrode, is used to keep the whole edge area of the chip at the same potential, and is therefore usually called an equipotential ring or EQR. This has the effect of maintaining a uniform breakdown voltage over the whole chip. The combination of the region 14 and the electrode 21 is normally called an edge structure or a termination structure.

Since the electrode 21 is connected to the collector C, when the IGBT is reverse-biased, in other words when the collector has a negative potential with respect to the emitter, the diode formed by the p-n junction between the region 14 and the epitaxial layer 11, in other words between the emitter electrode and the electrode 21, indicated by D in FIG. 1, is conducting. The IGBT can therefore be used in a bridge or in a half-bridge in the applications described above.

However, it has been found that the diode thus formed has a high resistance in forward conduction, and therefore the voltage drop across its terminals is high even with relatively low currents, for example more than 5 V for a current of 0.4 A, whereas a drop of approximately 2 V, like that of the IGBT in forward conduction, would be desirable. Moreover, the characteristics of the diode cannot be improved beyond a certain limit because they depend on parameters which cannot be modified without altering the characteristics of the IGBT, such as the perimeter of the termination region 14, the distance between the EQR electrode 21 and the P+ part 14" of the region 14, and the width of the P−region 14'.

SUMMARY OF THE INVENTION

The present invention provides an electronic device of the type described above having an integrated diode with operating characteristics.

BRIEF DESCRIPTION OF THE DRAWINGS

The invention will be more clearly understood from the following detailed description of some embodiments of the invention, provided with reference to the attached drawings, in which.

DETAILED DESCRIPTION OF THE INVENTION

Figure 1:
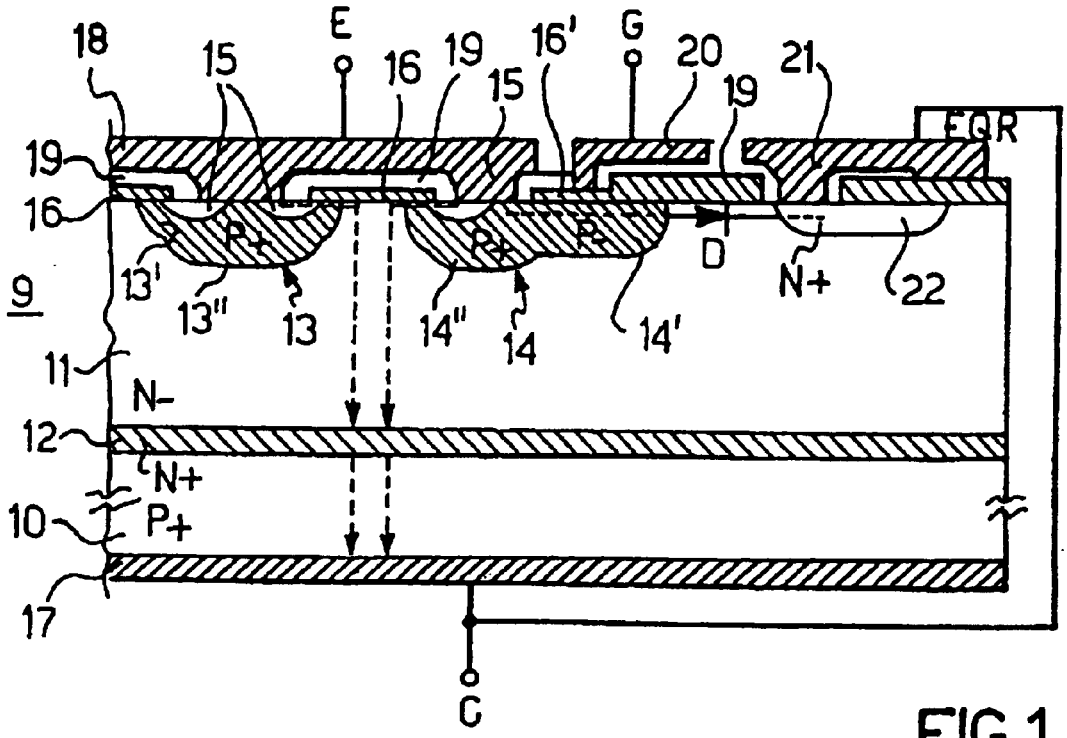
FIG. 1 is a section through a portion of a chip of semiconductor material containing a known device.
Figure 2:
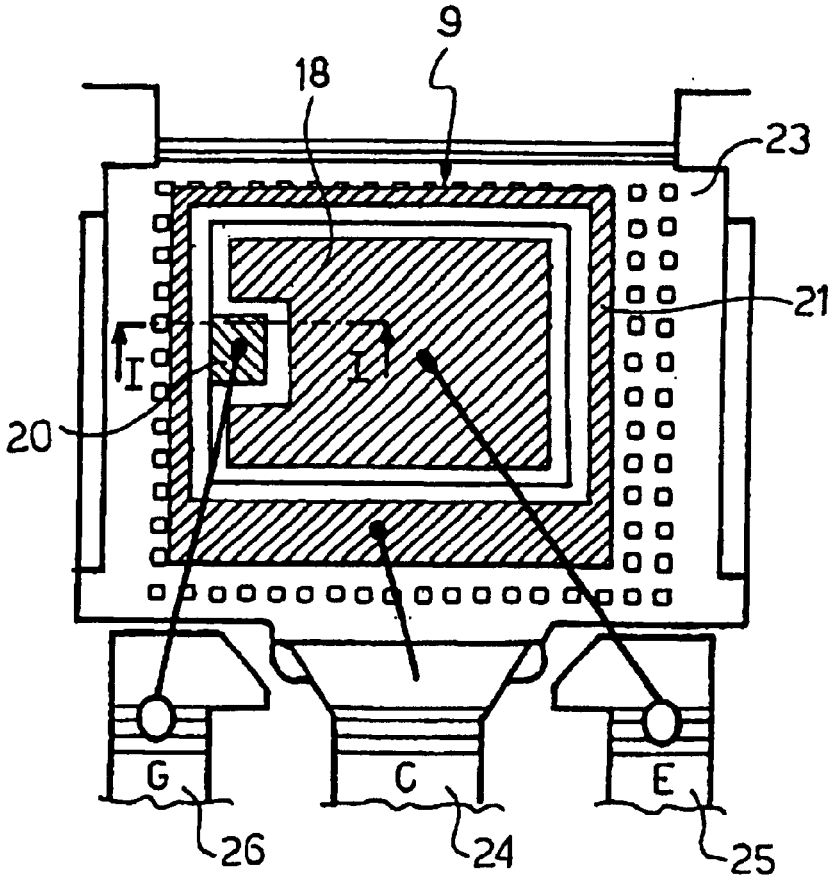
FIG. 2 shows in plan view, and not to scale, the chip in FIG. 1 mounted on a supporting structure.
Figure 3:
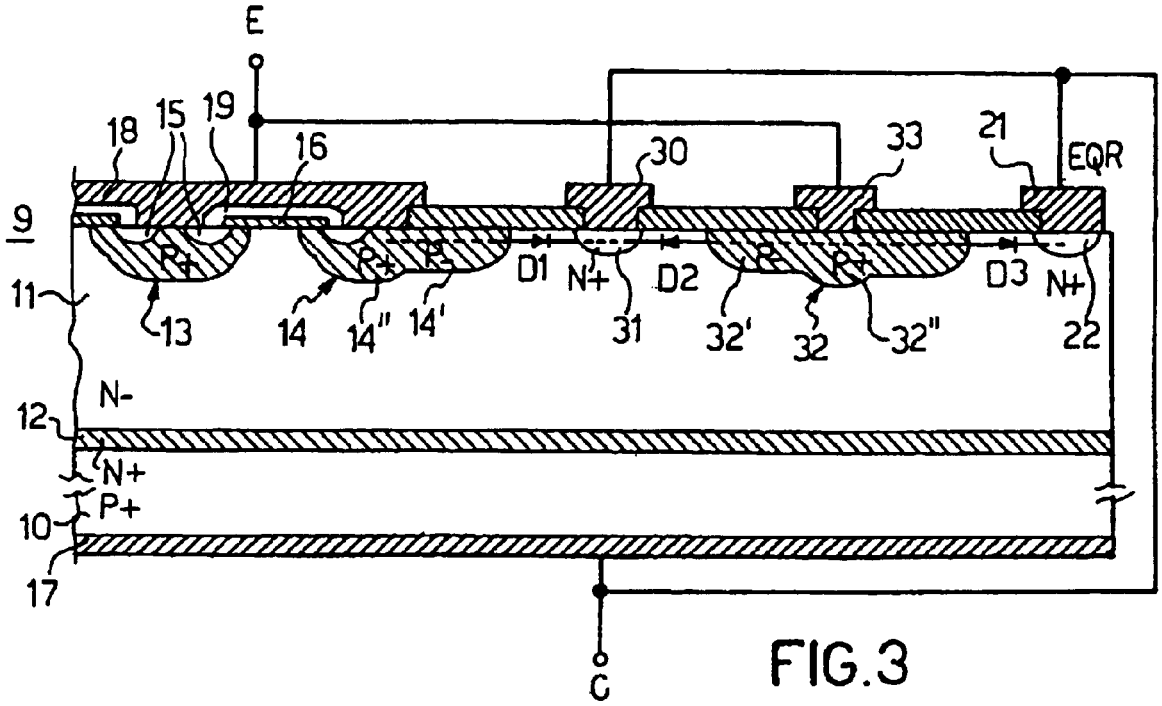
FIG. 3 is a section through a portion of a chip of semiconductor material containing a device according to the invention.
Figure 4:
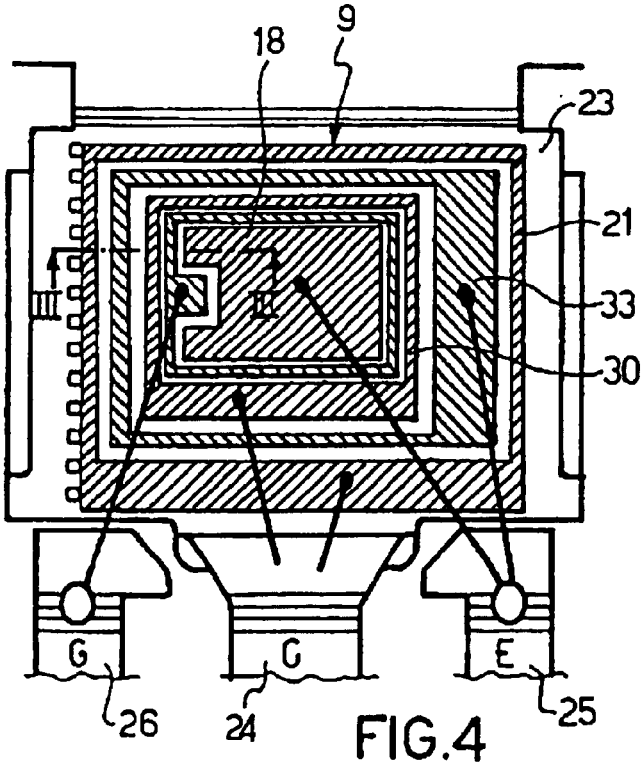
FIG. 4 shows in plan view, and not to scale, of the chip in FIG. 3 mounted on a supporting structure.

The device shown in FIGS. 3 and 4, in which elements identical to those of the structure in FIGS. 1 and 2 are denoted by the same reference numbers, differs in one respect from the known device in that the termination structure comprises, between the termination region 14 and the EQR electrode 21, a further electrode 30 in ohmic contact with the epitaxial layer 11 through a diffused high-concentration N type region 31, and a further P type termination region 32, formed by a low-concentration surface part 32' and a high-concentration deep part 32" and having a surface contact electrode 33.

As shown in plan view in FIG. 4, the electrode 30 surrounds, in the form of a frame, the active part of the device comprising the region 13 and any other P type regions identical to the region 13. The second termination region 32 is also shaped in the form of a frame which surrounds the electrode 30. The electrodes 18 and 33 are connected, by a metal wire in each case, to the emitter terminal 25 of the device, and the electrodes 21 and 30 are connected, by a metal wire in each case, to the collector terminal 24 of the device.

Preferably, the regions 13, 14 and 32 are formed simultaneously by the same operations of photographic processes, implantation and diffusion. The same is true of the N+ regions 22 and 31. The improved structure according to FIGS. 3 and 4 is therefore obtained without any supplementary operation.

Figure 5:
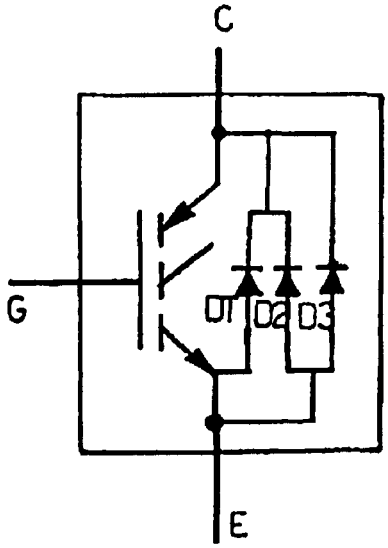
FIG. 5 shows an equivalent circuit diagram of the device according to the embodiments shown in FIGS. 3 and 4.

As shown in FIG. 3 and in FIG. 5, the new termination structure comprises three diodes D1, D2, D3 connected electrically between the emitter and collector terminals of the IGBT in parallel with each other and in the direction of conduction opposite that of the IGBT. Each of the three diodes has electrical characteristics substantially equivalent to those of the diode D according to the known art, since, for an equal distance between the N+ cathode contacts and the P+ anode region, the forward diode current depends on the perimeter of the regions which form its junction. The total forward current of the three diodes is therefore three times greater than that of the diode according to the known structure.

Figure 6:
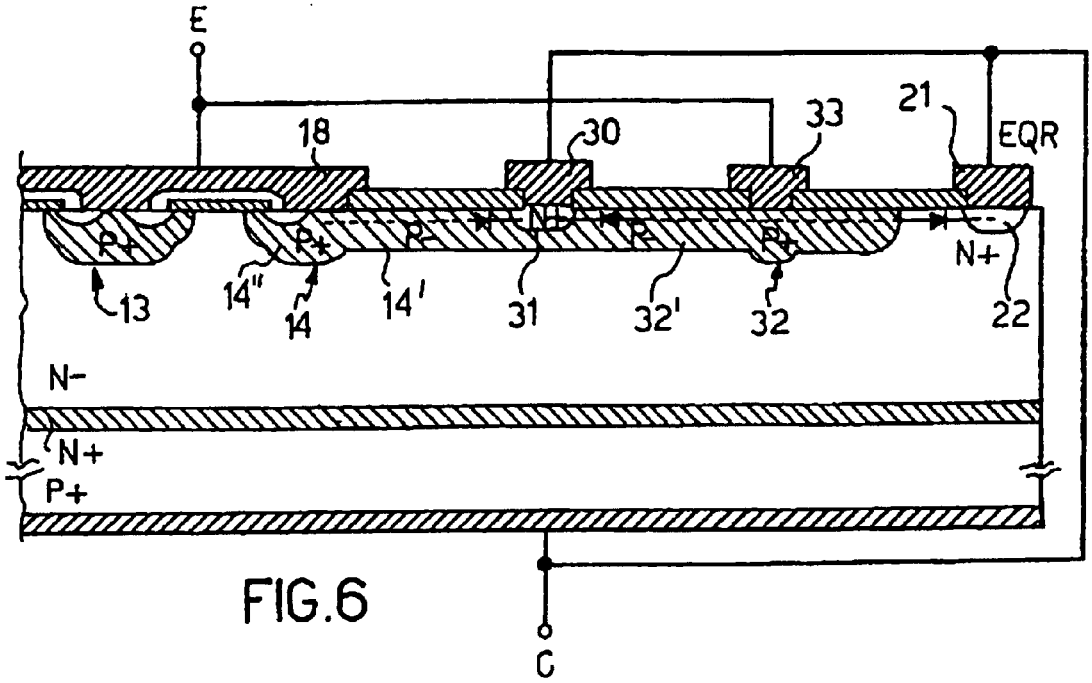
FIG. 6 is a section through a portion of a chip of semiconductor material, which shows a variant of the device according to the invention.
Figure 7:
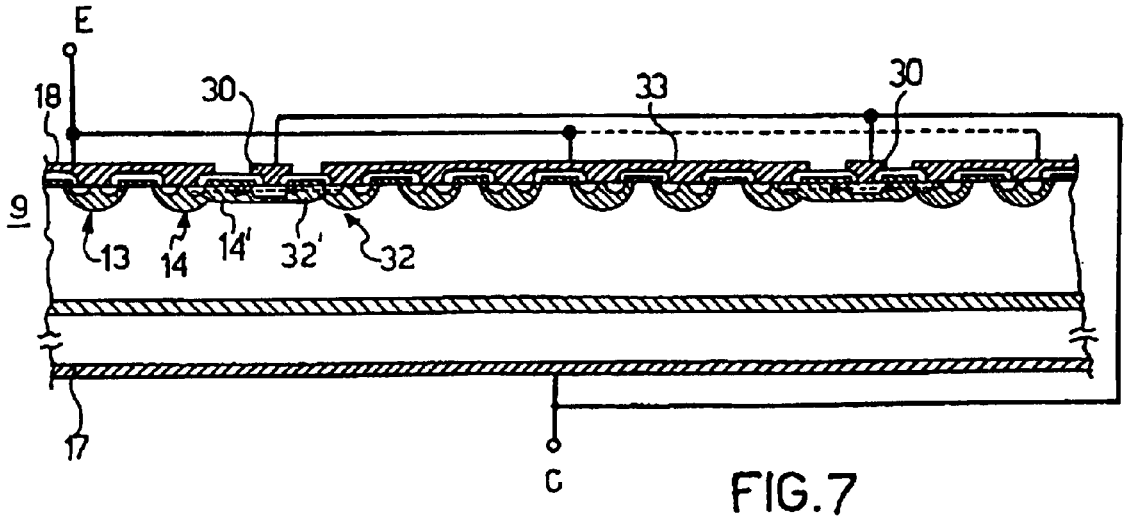
FIGS. 7 and 8 show, in section and in plan view respectively, a device according to another embodiment of the invention.
Figure 8:
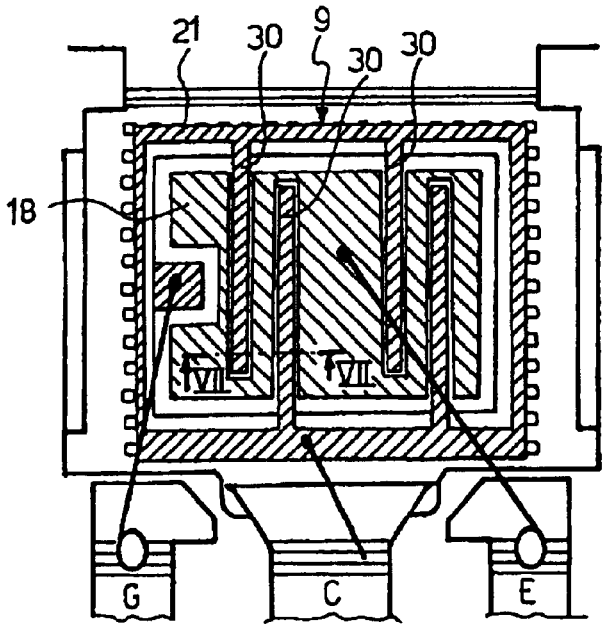

According to a variant of the invention shown in FIG. 6, in which elements identical or equivalent to those of FIG. 3 are denoted by the same reference numbers, the low-concentration surface parts 14' and 32' of the two termination regions 14 and 32 are combined in a single region and the diffused high-concentration N type region extends in this single region. This variant is particularly advantageous in the case in which the metallic element 18 which is in surface contact with the regions 13 and 14 is interdigitated with the electrode 30. In this way, the perimeter of the regions which form the reverse diode can be made as large as necessary by appropriate selection of the number of projections of the interdigitated structure, without adversely affecting the performance of the IGBT in terms of the breakdown voltage. A structure of this type is shown in section and in plan view in FIGS. 7 and 8 respectively, in which elements identical or equivalent to those of FIGS. 3, 4 and 6 are denoted by the same reference numbers.

Figure 9:
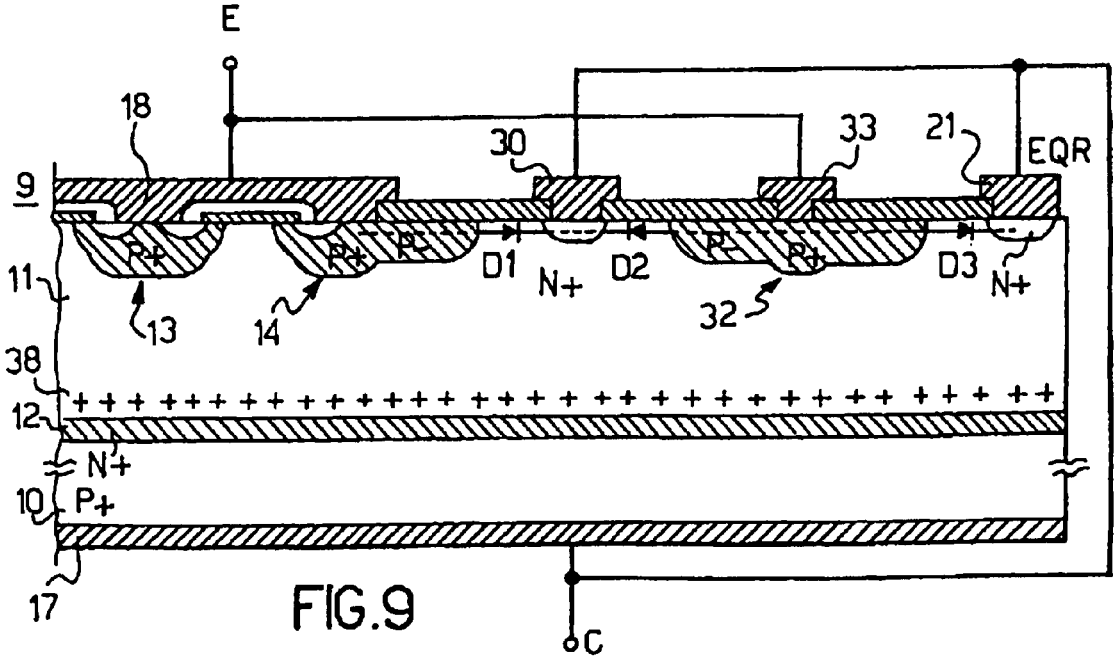
FIG. 9 is a section through a portion of a chip of semiconductor material containing a device according to a further embodiment of the invention.

The invention can be applied advantageously in all types of IGBT to be used in circuit configurations in which a reverse diode is necessary. When the IGBT has to be used as a high-frequency switch, there is a known arrangement of uniformly implanting and diffusing doping species, such as platinum or protons, capable of reducing the lifetime of the charge carriers, into the chip. This arrangement, however, has a negative effect on the diode, since it reduces the charge injection efficiency. To avoid this negative effect, according to an embodiment of the invention shown in FIG. 9, a buried layer 38 is formed, and the doping species capable of reducing the lifetime of the carriers are placed in it. In the structure shown, identical to that of FIG. 3 except for the presence of the buried layer, atoms, of helium for example, are implanted before or after the phase of epitaxial growth of the layer 11. The buried layer 38 is formed above the N+ "buffer" layer 12. In cases in which the buffer layer is not provided, the implantation takes place on the surface of the substrate 10 before the phase of epitaxial growth.

In operation, the buried layer 38 performs its function of improving the high-frequency performance of the IGBT by reducing its decay time, but has no effect on the performance of the diode in forward conduction, since the forward current of the diode is virtually exclusively of the lateral type; in other words, it flows parallel to the surface of the chip and close to the surface.

It is clear from the above description that the electronic device contains an integrated diode having electrical characteristics that are markedly better than those of the known integrated diode. In particular, the voltage drop obtained across the diode in forward conduction is very close to that of the IGBT in conduction, for virtually any operating current of the device.

Although the invention has been illustrated and described with reference to an IGBT formed on a P+substrate, it should be understood that it can also be applied on an N+substrate; clearly, in this case, the type of conductivity of all the layers and all the regions would be complementary. It should also be understood that the invention can additionally be applied advantageously in devices of types other than the IGBT, for example in bipolar junction power transistors to be used as electronic switches in bridge or half-bridge configurations.

What is claimed is:

1. An electronic device formed on a chip of semiconductor material comprising:

a substrate having a first type of conductivity and a plurality of surfaces, one of whose surfaces is a bottom surface of the chip, a layer having a second type of conductivity formed on the substrate and having a surface which is a top surface of the chip, at least one first region having the first type of conductivity[.] that extends into the layer from the top surface, a termination structure comprising:

a first termination region having the first type of conductivity[,] that extends into the layer from the top surface and is shaped in such a way that it surrounds the at least one first region, a first electrode in contact with the first termination region, a second electrode in contact with the layer on the top surface[.] *and* shaped in the form of a frame close to the edge of the chip, a third electrode in contact with the bottom surface of the chip and connected electrically to the second electrode,

[a second termination region having the first type of conductivity, which extends into the layer from the top surface, and shaped in the form of a frame surrounding the fifth electrode,]

a fourth electrode in contact with the at least one first region and connected electrically to the first electrode, [and]

a fifth electrode in contact with the layer on the top surface along a path that extends substantially parallel to at least part of an edge of the first termination region and connected electrically to the second electrode*, and*

*a second termination region having the first type of conductivity, which extends into the layer from the top surface, and shaped in the form of a frame surrounding the fifth electrode.*

2. The device of claim 1 wherein the each of the first and the second termination regions comprises a low-concentration surface part and a high-concentration deep part.

3. The device of claim 2 wherein the low-concentration surface parts of the first and the second termination regions are combined in a single region and wherein the termination structure comprises a region having the second type of conductivity at high concentration that extends into the surface parts common to the first and the second termination regions from the portion of the front surface of the chip with which the fifth electrode is in contact.

4. The device of claim 1 wherein the first and the fourth electrodes comprise a single metallic element.

5. The device of claim 1 in which the path along which the fifth electrode extends is shaped in the form of a frame that encloses the at least one first region.

6. The device of claim 4 wherein the metallic element and the fifth electrode are interdigitated.

7. The device of claim 1 wherein the chip of semiconductor material comprises a buried layer containing doping species that reduce the lifetime of the charge carriers.

8. The device of claim 7 wherein the doping species comprise helium atoms.

*9. The device of claim 1, further comprising a sixth electrode in contact with the second termination region and connected electrically to the first electrode.*

*10. An electronic circuit formed on a chip of semiconductor material having a substrate and an epitaxial layer, the circuit comprising:*

*a diffused region extending in the epitaxial layer; and*

*a termination structure comprising a first termination region formed in the epitaxial layer and configured to surround the diffused region, a first electrode in contact with the first termination region, and a frame electrode shaped in the form of a frame close to an edge of the chip and in contact with the epitaxial layer, a further electrode coupled between the epitaxial layer and the frame electrode, a second termination region formed in the epitaxial layer and surrounding the further electrode, and a surface contact electrode coupled between the second termination region and the first electrode.*

*11. The circuit of claim 10 wherein the first and second termination regions each comprise a low-concentration surface part and a high-concentration deep part.*

*12. An IGBT device having a substrate of first conductivity with an epitaxial layer of second conductivity formed thereon, comprising:*

*first and second termination regions formed in the epitaxial layer and surrounding a diffused region, a first electrode in contact with the first termination region, a surface contact electrode in contact with the second termination region and the first electrode, a second electrode shaped in the form of a frame close to an edge of the substrate, and a further electrode in contact with the epitaxial layer and the second electrode, the second termination region surrounding the further electrode.*

*13. The device of claim 12, wherein the further electrode is in electrical contact with the substrate.*

*14. An IGBT device, comprising:*

*a termination structure formed in an epitaxial layer on a substrate, the termination structure comprising a first termination region formed in the epitaxial layer, a frame electrode formed in the shape of a frame and near an edge of the epitaxial layer, a further electrode in contact with the frame electrode and the epitaxial layer, and a second termination region formed in the epitaxial layer and surrounding the further electrode and electrically coupled to the first termination region.*

*15. The device of claim 14, further comprising a surface contact electrode in contact with the first termination region and the second termination region.*

* * * * *

UNITED STATES PATENT AND TRADEMARK OFFICE

CERTIFICATE OF CORRECTION

PATENT NO. : RE 40,222 E
APPLICATION NO. : 10/423493
DATED : April 8, 2008
INVENTOR(S) : Leonardo Fragapane It is certified that error appears in the above-identified patent and that said Letters Patent is hereby corrected as shown below:

On the Title Page
Item (73) Assignee, ""STMicroelectronics S.r.l.(IT)" should read as
-- STMicroelectronics S.r.l., Agrate Brianza (IT) --

Item (57) Abstract, line 1, "A device including an IGBT a formed on a chip of silicon" should read as -- A device including an IGBT formed on a chip of silicon --

Column 5
Line 46, "electrode, [and]" should read as -- electrode, --

Lines 56-57, "The device of claim 1 wherein the each of the first and second termination regions comprises" should read as -- The device of claim 1 wherein each of the first and second termination regions comprises --

Column 6
Line 1, "regions from the portion of the front surface of the chip" should read as
-- regions from a portion of a front surface of the chip --

Line 12, "species that reduce the lifetime of the charge carriers" should read as
-- species that reduce the lifetime of charge carriers --

Signed and Sealed this

Tenth Day of March, 2009

JOHN DOLL
*Acting Director of the United States Patent and Trademark Office*